INVENTOR.
ALBERT SCHMITZ
BY
Frank R. Trifari
AGENT

INVENTOR.
ALBERT SCHMITZ
BY
Frank R. Trifari
AGENT

United States Patent Office 3,605,256

Patented Sept. 20, 1971

3,605,256

METHOD OF MANUFACTURING A TRANSISTOR AND TRANSISTOR MANUFACTURED BY THIS METHOD

Albert Schmitz, Emmasingel, Eindhoven, Netherlands

Filed Oct. 2, 1968, Ser. No. 764,580

Claims priority, application Netherlands, Oct. 7, 1967, 6713666

Int. Cl. B01j *17/00;* H01l *5/00*

U.S. Cl. 29—578 12 Claims

ABSTRACT OF THE DISCLOSURE

A method of manufacturing a double-diffused transistor using an integral masking layer by the so-called planar process in which, after the emitter region is formed by diffusion through an emitter window in the masking layer, the earlier provided base window is entirely reopened exposing the emitter base junction at the surface, following which a second masking layer is provided on the exposed semiconductor surface and windows established therein for providing contacts to the emitter and base regions.

Figure 1:
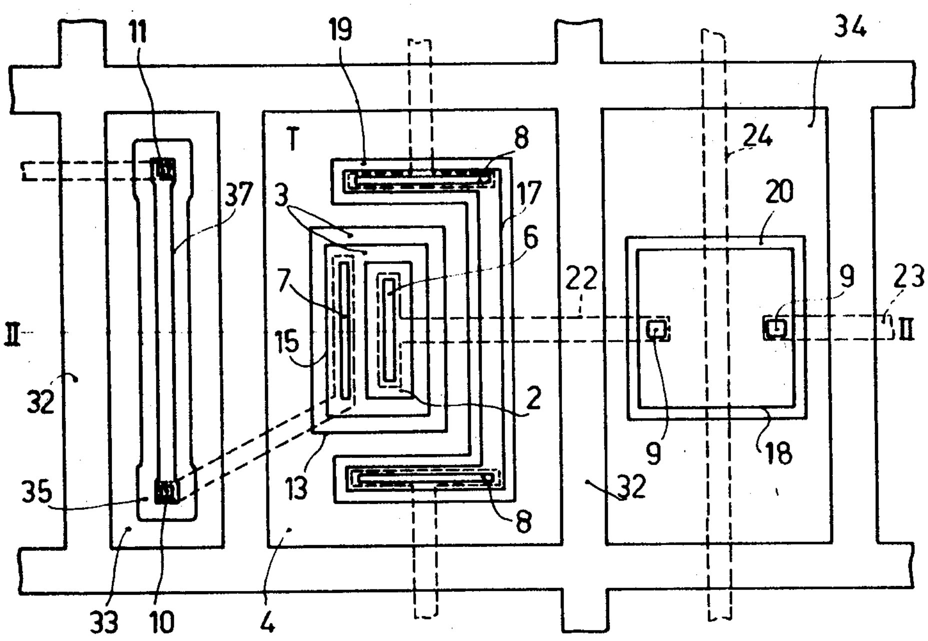

The invention relates to a method of manufacturing a transistor in which a surface of a semiconductor body a diffusion masking layer is provided which comprises a window, the base window, a base region being provided by diffusion of an impurity through the base window into the semiconductor body, the window being closed after which a smaller window, the emitter window, is provided and an emitter region is provided by diffusion of an impurity through the emitter window into the semiconductor body, which emitter region adjoins the said surface and is entirely surrounded in the semiconductor body by the base region, the part of the semiconductor body surrounding the base region constituting the collector region. The invention furthermore relates to a transistor manufactured by using the method.

By means of a method of the above-mentioned type, so-called planar transistors are manufactured. The emitter window is usually closed after or during providing the emitter region, after which the diffusion mask is provided with apertures to contact at least the base and the emitter regions. The diffusion window, usually consisting of silicon oxide, remains on the semiconductor body as a protecting and/or stabilizing layer.

Although the diffusion mask has a favourable influence on the properties of the transistor as a protecting and/or stabilizing layer, the method described in which the diffusion mask remains present does not give full satisfaction. The quality of the diffusion masking layer as a protecting and/or stabilizing layer is adversely influenced by the diffusion treatment. Furthermore, the diffusion masking layer after the diffusion treatments does not everywhere have the same thickness as a result of opening and closing again the windows. The thickness is smallest in the window which is closed last and is largest at the area where no window is provided. This means that the apertures for contacting have to be provided in parts of the diffusion masking layer which have different thicknesses. The apertures are provided by etching, it being necessary, after an aperture has already been obtained in a thin part of the layer, to continue the etching treatment until an aperture has also been obtained in a thicker part of the layer. This means that in the thinnest part of the layer an aperture can often not be provided with the desired accuracy.

In order to be able to provide the apertures for contacting by etching, an etchant-masking layer has to be provided on the diffusion masking layer. The adhesion of the latter layer to the diffusion masking layer, however, is deteriorated by the preceding diffusion treatments, which introduces inaccuracies in providing the apertures.

The emitter region is usually provided by diffusion of phosphorus while, if a transistor associated with, for example, a monolithic integrated circuit is manufactured, often further regions have to be provided simultaneously by the diffusion of phosphorus. Upon closing the windows through which phosphorus is diffused into the semiconductor body, a strongly phosphorus-containing oxide layer is formed. If conductors are provided over such phosphorus-containing layers, there appears to be a fair chance of short-circuit with adjacent parts of the semiconductor body, which adversely influences the efficiency of the method.

It has already been proposed to remove entirely the diffusion masking layer and replace it by a new protecting and/or stabilizing silicon oxide layer after the diffusion treatment for obtaining the emitter region. However, this method also does not give full satisfaction since due to the replacement of the diffusion masking layer by a new oxide layer the electrical properties of the transistor are often deteriorated. Furthermore a thin new oxide layer is desirable for providing with great precision apertures in this layer for contacting. However, conductors have often to be provided on the oxide layer and these conductors are preferably provided on a thick oxide layer to keep the capacitance between the conductors and the semiconductor body small. A new oxide layer can often not satisfactorily meet said contradictory requirements.

One of the objects of the invention is to provide a method in which the drawbacks of the described known methods are avoided.

The invention is inter alia based on the recognition of the fact that the said drawbacks can be avoided by removing only part of the diffusion masking layer after the diffusion through the emitter window.

According to the invention, a method of the type mentioned in the preamble is characterized in that after the diffusion through the emitter window the base window is re-opened entirely after which an insulating layer is provided at least in said window on the surface of the semiconductor body, and said insulating layer is provided with apertures for contacting the emitter and base regions.

As a result of this a protecting and/or stabilizing layer is obtained which consists of a part of the original diffusion masking layer, which covers the line of intersection of the base-collector junction with the surface of the semiconductor body resulting in preventing deterioration of the electric properties of the transistor, and of the new insulating layer in which the apertures for contacting the base and emitter regions are provided. So it is no longer necessary to provide these apertures in parts of the layer having different thicknesses. Since the insulating layer is not subjected to diffusion treatments, no difficulties occur with regard to the adhesion of the etching mask to be used in providing the apertures by etching. Since the diffusion masking layer in the base window is thinner than beyond said window, the base window can simply be re-opened by dipping in an etchant in which moreover the diffusion masking layer beyond the base window is cleaned. The new insulating layer may be thinner than the remaining part of the diffusion masking layer so that the above-mentioned contradictory requirements regarding the thickness of the protecting layer can better be satisfied.

An important embodiment of a method according to the invention is characterized in that simultaneously with the emitter window at least one further window located outside the base window is provided in the diffusion masking layer, while through said further window and the emitter window the same impurity is diffused into the semiconductor body after which simultaneously with the reopening of the base window the surface of the semiconductor body is exposed at the area of the further window, while the insulating layer is also provided on the said exposed surface and is provided there with an aperture for contacting the the semiconductor body. This embodiment is of importance inter alia for manufacturing transistors in which the collector region is contacted on the same side of the semiconductor body as the base and emitter regions and in which a diffused contact layer is provided in the collector region by means of the diffusion through a further window. Since the insulating layer is also provided in the further window and is provided there with an aperture for contacting, the apertures for contacting the emitter, base and collector regions are provided in parts of the insulating layer having substantially the same thickness so that the apertures, as already explained, can be provided with great accuracy. When the base window is reopened by dipping the semiconductor body in an etchant, the surface of the semiconductor body is simultaneously exposed at the area of the further window.

Furthermore the embodiment is of importance for manufacturing a transistor associated with an integrated circuit in which through a further window a diffused region is provided to which two conductors are connected, a third conductor being provided across the insulating layer provided in the said further window, so that crossing without shorting of conductive connections is obtained. When the further window during the provision of the diffused region is closed again, and the third conductor is then provided short circuits between said third conductor and the diffused region can easily occur due to the inferior quality of the insulating layer obtained in closing the window.

A very important embodiment of a method according to the invention in which a transistor is manufactured which is associated with an integrated circuit is characterized in that after providing the base and emitter regions of the transistor and the further diffused regions of at least one further semiconductor circuit element, the surface of the semiconductor body corresponding to the windows associated with at least those further regions which have to be contacted are also exposed upon reopening the base window, while the insulating layer is also provided on said exposed surface areas and is provided there with apertures for contacting said further regions. In this manner all apertures for contacting can be provided with substantially the same thicknesses in parts of the insulating layer.

Preferably a diffusion mask of silicon oxide is used. The insulating layer which is provided preferably consists also of silicon oxide. The diffusion mask, like the insulating layer, may furthermore consist, for example, of silicon nitride.

When the insulating layer is provided, a stabilizing layer, preferably a layer of phosphorglass (oxide layer containing phosphorous), may be provided on said layer.

The insulating layer may consist of silicon oxide and be provided by thermal oxidation. Due to the high temperatures occurring in the said oxidation, the impurities provided in the semiconductor body by diffusion, diffuse deeper into the semiconductor body. This may be undesirable, for example, if the emitter region has to be very thin. An embodiment of a method according to the invention is therefore characterized in that the insulating layer is provided by sputtering or pyrolytically. In this manner the insulating layer can be provided at far lower temperatures.

The invention futhermore relates to a transistor having a semiconductor body comprising an emitter region, a base region and a collector region, while on at least one surface of the semiconductor body an insulating layer is provided which comprises apertures for contacting at least the emitter and base regions and in which the parts of the insulating layer adjoining said apertures have the same thicknesses, said thickness being smaller than the thickness of those parts of the insulating layer which cover the line of intersection of the base-collector junction with the said surface, said transistor being manufactured by using a method according to the invention.

Figure 2:
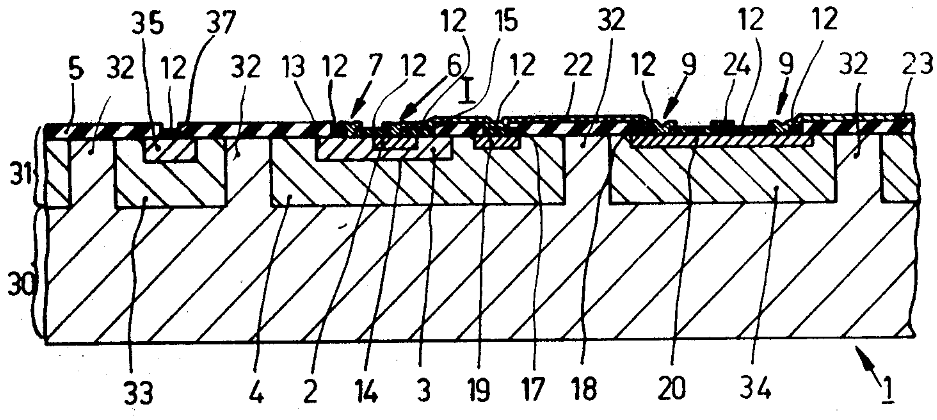

In order that the invention may be readily carried into effect, one example thereof will now be described in greater detail, by way of example, with reference to the accompanying drawings, in which FIG. 1 diagrammatically shows a plan view of an example of a transistor according to the invention associated with an integrated circuit, of which FIG. 2 diagrammatically shows a cross-sectional view taken on the line II—II of FIG. 1 and of which FIGS. 3 to 6 are diagrammatic cross-sectional views of a number of stages of the integrated circuit shown in FIGS. 1 and 2 during its manufacture by using a method according to the invention.

FIGS. 1 and 2 show an example of a transistor T according to the invention having a semiconductor body 1 comprising an emitter region 2, a base region 3 and a collector region 4 and an insulating layer 5, 12 provided on a surface of the semiconductor body 1 and having apertures 6 and 7 for contacting the emitter region 2 and the base region 3. The parts 12 of the insulating layer 5, 12 adjacent the apertures 6 and 7 have substantially the same thicknesses, which thickness is smaller than the parts 5 of the insulating layer 5, 12 which cover the line of interesection 13 of the base-collector junction 14 with the said surface.

The transistor T can be obtained as follows.

Figure 3:
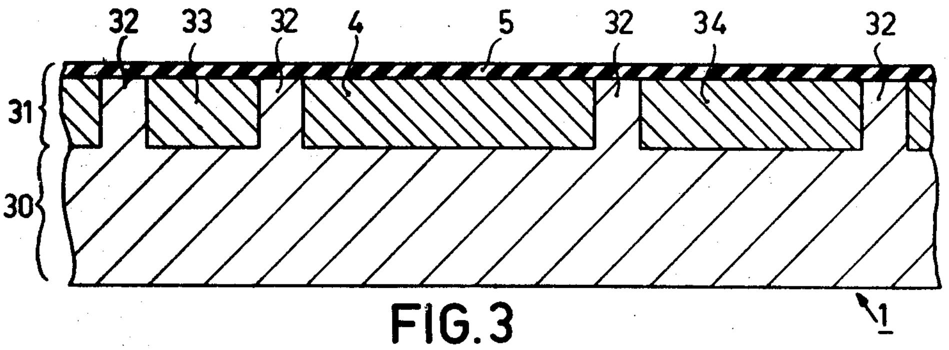

A diffusion masking layer 5, for example, of silicon oxide, is provided on the surface of the semiconductor body 1 (FIG. 3). A window, the base window 15 (FIG. 4), is provided in the layer 5 while by diffusion of an impurity through the base window 15 into the body 1 the base region is provided, the window 15 being closed again. A smaller window, the emitter window 16 (FIG. 5) is then provided and by diffusion of an impurity through the emitter window 16 in the semiconductor body 1, the emitter region 2 is obtained which adjoins the surface covered by the layer 5 and in the body 1 is surrounded by the base region 3. The part 4 of the semiconductor body surrounding the base region constitutes the collector region of the transistor.

According to the invention, the base window 15 is reopened entirely after the diffusion through the emitter window 16, said window being closed again usually during the emitter diffusion step. See FIG. 6. An insulating layer 12 (see FIG. 2) is then provided in the base window 15 and is provided with apertures 6 and 7 to contact the emitter region 2 and the base region 3.

In the present example the windows 17 and 18 which are located beyond the base window 15 are provided simultaneously with the emitter window 16. Through these further windows 17 and 18 the emitter window 16 the same impurity is diffused into the semiconductor body 1 so that the regions 19 and 20 of the same conductivity type as the emitter region 2 are obtained.

Figure 6:
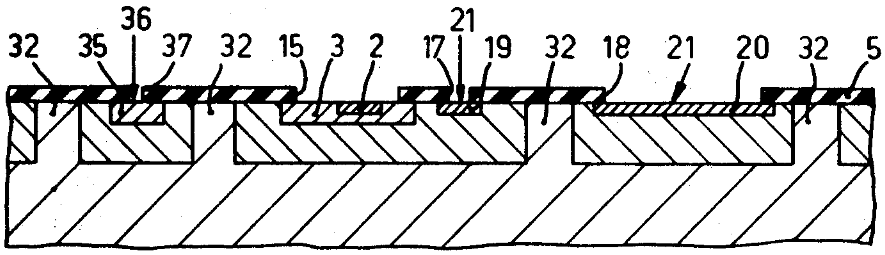

During reopening the base window 15, the surface of the body 1 at the area of the further windows 17 and 18 is exposed (FIG. 6) while the insulating layer 12 is also provided on said exposed surface 21 and is provided there with apertures 8 and 9 for contacting the body 1 (FIGS. 6, 1 and 2).

Due to the diffusion through the window 17, the diffused contact layer 19 in the collector region 4 is obtained.

Due to the diffusion through the window 18 a readily conducting region 20 is provided to which two conductors 22 and 23 are connected through the apertures 9 in the layer 12. A third conductor is provided across the insulating layer 12 provided in said further window 18, so that an intersection of conductive connections (the connection 22–20–23 and the connection 24) is obtained.

The present example relates to the manufacture of the transistor T associated with an integrated circuit, in this case a monolithic circuit. Only a part hereof is shown diagrammatically in FIGS. 1 to 6, since the aspect of the invention can sufficiently be explained with reference to this part.

The semiconductor body 1 of the monolithic circuit consists in a conventional manner of a substrate 30 of one conductivity type, for example, p-conductive, on which an epitaxial layer of the opposite conductivity type (n-type) is provided, which layer 31 is divided in a conventional manner by regions 32 of one conductivity type (p-type) into (n-type) parts inter alia 4, 33 and 34, usually termed islands.

A further semiconductor circuit element in the form of a resistor is provided in the island 33. The resistor comprises the diffused regions 35 of one conductivity type. The monolithic circuit comprises a larger number of islands and a larger number of circuit elements which, however, are not shown in the figures to avoid complexity of the drawing.

According to the invention, in manufacturing such an integrated circuit and after providing the base region 3 and the emitter region 2 of the transistor T and of the further diffused region 35 of the further semiconductor circuit element, in reopening the base window 15 the surface 36 (FIG. 6) of the semiconductor body 1 is also exposed at the area of the window 37 corresponding to the further region 35 which is to be contacted, while the insulating layer 12 (FIGS. 1 and 2) is also provided on said exposed surface 36 and is provided with apertures 10 and 11 for contacting the further region 35.

In the manufacture, a semiconductor body 1 (FIG. 3) consisting of a monocrystalline p-type silicon substrate 30 having a resistivity of 3–5 ohm.cm. and a thickness of approximately 250 microns, and an n-type epitaxial silicon layer 31 provided thereon and having a resistivity of approximately 0.3 ohm.cm. and a thickness of approximately 10$\mu$ is used as the starting material. The dimensions of the bodies 1 are of no significance and should only be sufficiently large to provide the desired number of circuit elements.

In any conventional manner the epitaxial layer 31 is divided into n-type islands (4, 33 and 34) by providing the diffused p-type regions 32. A diffusion masking layer 5 of silicon oxide, thickness approximately 0.6$\mu$, is provided on the epitaxial layer in any conventional manner.

The base window 15 (FIG. 4), dimensions approximately 70 x 34$\mu$, and the further window 37, dimensions approximately 140 x 10$\mu$ are provided in the diffusion masking layer 5. The windows may be provided in any conventional manner by means of a photolithographic process and an etchant.

Figure 4:
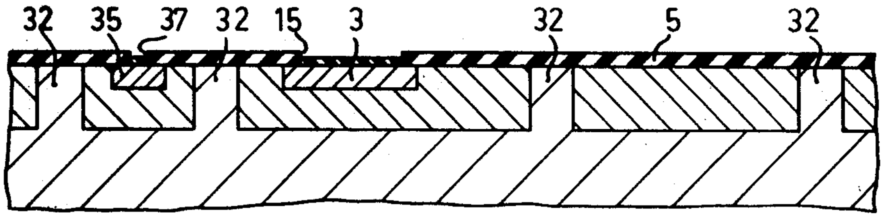
Figure 5:
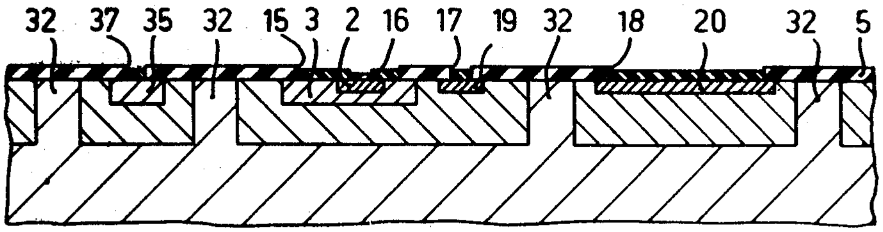

The p-type base region 3 and the p-type region 35 are provided in any conventional manner by the diffusion of boron through the windows 15 and 37 into the semiconductor body 1 and have a thickness of approximately 1.8 to 1.9$\mu$. During providing the regions 3 and 35, a boron-containing oxide layer is formed in the windows 15 and 37, by which the windows 15 and 37 are closed. This boron-containing oxide layer is thinner than the adjacent part of the diffusion masking layer 5 as is shown in FIG. 4.

The emitter window 16 (FIG. 5), dimensions approximately 60 x 10$\mu$, and the further windows 17 and 18 are then provided and the n-type emitter region 2, the n-type collector contact region 19 and the n-type region 20 are then provided in any conventional manner by the diffusion of phosphorus through said windows into the semiconductor body. The thickness of said regions is kept small, for example, a few tenths of a micron, since, during subsequent temperature treatments, the phosphorus diffuses deeper into the body 1. The ultimate thickness of said regions may be, for example, approximately 1.3$\mu$. The width of the collector contact region 17 may be, for example, 10 to 25$\mu$. The dimensions of the window 18 may be, for example, 70 x 70$\mu$.

During the diffusion of phosphorus, phosphorus glass is formed in the windows 16, 17 and 18, so that said windows are closed again. The phosphorus glass is thinner than the adjacent parts of the oxide layer 5.

It is to be noted that during closing windows, material is also added to the layer 5 beyond said windows, so that the diffusion masking layer 5 beyond the windows is somewhat thicker and shows a strongly contaminated surface layer, in the present example, contaminated by boron and phosphorus.

If aperture would be provided again in the closed diffusion masking layer 5 for contacting the provided regions, the provision of an etchant-masking layer on the layer 5 is necessary. The adhesion of such an etching mask on the layer 5, however, is less favourable due to the said impurity which may introduce inaccuracies.

The difference in thickness in the layer 5 is furthermore disturbing. The apertures for contacting are simultaneously provided by etching and it will be obvious that an aperture in a thinner part of the layer is obtained sooner than an aperture in a thicker part of the layer 5. The accuracy with which an aperture is provided in a thin part of the layer 5 hence becomes less good because the oxide layer is etched away too much in a lateral direction.

Furthermore in providing a conductor across a phosphorus glass layer present in the windows 17 and 18, short-circuit between the conductor and the underlying region may easily occur which could be particularly disadvantageous with respect to the conductor 22 and the collector contact region 19 and the conductor 24 and the region 20 (FIG. 1).

In order to avoid the said drawbacks, the base window 15 and the further windows 17, 18 and 37 are reopened (FIG. 6). This may be done simply by dipping the body 1 in a conventional etchant for a period of time until the windows are opened. The remaining part of the layer 5 will become thinner and its contaminating surface layer will be removed so that an etching mask to be used in the next process step can readily adhere to the layer 5. The exposed surface parts of the body 1 are cleaned, for example, by dipping the body 1 in boiling nitric acid (65%) for approximately 30 minutes and then rinsing in deionized water.

The new insulating layer 12 (FIG. 2), thickness, for example, 0.2 to 0.3 micron, is then provided in the windows 15, 17, 18 and 37. The layer 12 consists, for example, of silicon oxide and may be provided by oxidation. For that purpose, steam may be conducted over the body 1 for approximately 20 minutes, the body 1 being kept at a temperature of approximately 900° C. Beyond the windows the layer 5 will become slightly thicker again.

It is alternatively possible to replace the whole layer 5 by a new silicon oxide layer, but it has been found that the electrical properties of the transistor can be considerably deteriorated which is prevented by opening only the base window 15 and the further windows 17, 18 and 37, the line of intersection 13 of the base collector junction 14 with the surface of the body 1 covered by the layer 5 remaining covered by the original diffusion masking layer 5.

The apertures 6, 7, 8, 9, 10 and 11 for contacting the regions 2, 3, 19, 20 and 35 are then provided in any conventional manner and while using an etching mask in the layer 12 which has everywhere substantially the same thickness.

This contacting may be carried out in any conventional manner. In the example shown in FIGS. 1 and 2, the conductors which contact the regions 2, 3, 19, 20 and 35 through the apertures in the layer 12 are shown in broken lines. The conductors may consist, for example, of aluminum deposited from the vapour phase.

In FIG. 1, the layer 5, 12 is assumed to be transparent so that the underlying regions are visible.

Before providing the apertures in the insulating layer 12, a layer, which may consist of phosphorus glass and promotes the stability of the semiconductor device, may be provided on the layer 5, 12. Since the phosphorus concentration in this layer may be low, said layer need not experience any adverse influence on the adhesion of an etching mask.

If a very thin emitter region is desirable, the insulating layer 12 must not be provided by oxidation at a high temperature but by means of a method in which the layer 12 is provided at a considerably lower temperature. For this purpose various methods are known. In this case the layer 12 may be provided in any conventional manner, for example, pyrolytically or by sputtering.

It will be obvious that the invention is not restricted to the example described and that many variations are possible to those skilled in the art without departing from the scope of this invention. The invention is not restricted to integrated circuits but also relates to individual resistors, having, for example, the contacted base and emitter regions on one side of a semiconductor body, while on the opposite located side of the semiconductor body the collector region is contacted. For the rest, an integrated circuit having a transistor according to the invention may comprise other and more further circuit elements than are mentioned in the example with reference to the figures. The diffusion masking layer 5 and the insulating layer 12 may consist of a material other than silicon oxide, for example, silicon nitride. The semiconductor body may consist of conventional semiconductor materials other than silicon.

What is claimed is:

1. A method of manufacturing a transistor device, comprising the steps of forming on a surface of a semiconductor body a first diffusion masking layer, opening up a base window in the first diffusion masking layer, diffusing base-forming impurities through the base window into the body to form a base region and with the surrounding semiconductor a base-collector junction which extends to the body surface and closing the base window with a second insulating layer, opening up in the second insulating layer an emitter window which is smaller than the base window, diffusing emitter-forming impurities through the emitter window into the body to form an emitter region and with the surrounding base region an emitter-base junction which extends to the body surface, thereafter removing the second insulating layer to reopen entirely the base window exposing the body surface, forming on the body surface within the reopened base window a third insulating layer, thereafter forming in the third insulating layer a base aperture over the base region and an emitter aperture over the emitter region, and contacting the base and emitter regions through their respective base and emitter apertures.

2. A method as claimed in claim 1, wherein simultaneously with the formation of the emitter window at least one further window located outside the base window is formed in the first diffusion masking layer, thereafter through said further window and the emitter window the same impurities are diffused into the semiconductor body closing the emitter and further windows, thereafter simultaneously with the reopening of the base window the said further window is reopened exposing the surface of the semiconductor body at the area of the further window, and thereafter the third insulating layer is also provided on the said exposed surface through the further window and is provided there with a further aperture for contacting the semiconductor body.

3. A method as claimed in claim 2, wherein a diffused contact layer is provided in the body region surrounding the base region by means of the impurity diffusion through the said further window.

4. A method as claimed in claim 2, wherein two conductors are connected to the diffused region formed by diffusion through said further window, and a third conductor is provided across the third insulating layer in said further window so that a crossing without shorting of conductive connections is obtained.

5. A method as claimed in claim 2 wherein after providing the base and emitter regions of the transistor and the further diffused region by diffusion through the said further window, the surface area of the semiconductor body corresponding to the window associated with at least the said further region which has to be contacted is also exposed during reopening of the base window, and the third insulating layer is also provided on said exposed surface area and is provided there with at least one aperture for contacting said further region.

6. A method as claimed in claim 1 wherein the first diffusion mask is of silicon oxide.

7. A method as claimed in claim 4 wherein the third insulating layer is of silicon oxide.

8. A method as claimed in claim 1 wherein a layer of phosphorglass is provided across the third insulating layer.

9. A method as claimed in claim 1 wherein the third insulating layer is provided by sputtering or pyrolytically.

10. A method as set forth in claim 1 wherein the second insulating layer is thinner than the first diffusion masking layer.

11. A method as set forth in claim 1 wherein the third insulating layer is of uniform thickness and thinner than the first diffusion masking layer.

12. A method as set forth in claim 11 wherein the contacts for the base and emitter regions extend on and over the third insulating layer and the first diffusion masking layer.

References Cited

UNITED STATES PATENTS

| | | | |
|---|---|---|---|
| 3,281,915 | 11/1966 | Schramm | 148—1.5 |
| 3,442,011 | 5/1969 | Strieter | 29—578 |
| 3,490,963 | 1/1970 | Sprague | 148—187 |

JOHN F. CAMPBELL, Primary Examiner

W. TUPMAN, Assistant Examiner

U.S. Cl. X.R.

29—577, 590; 148—187

PO-1050
(5/69)

UNITED STATES PATENT OFFICE
CERTIFICATE OF CORRECTION

Patent No. 3605256 Dated September 20, 1971

Inventor(s) ALBERT SCHMITZ

It is certified that error appears in the above-identified patent and that said Letters Patent are hereby corrected as shown below:

First line of the heading should have read -- Albert Schmitz, Emmasingel, Eindhoven, Netherlands, assignor to U. S. Philips Corporation, New York, New York -- .

Signed and sealed this 22nd day of February 1972.

(SEAL)
Attest:

EDWARD M.FLETCHER,JR.
Attesting Officer

ROBERT GOTTSCHALK
Commissioner of Patents